(12) United States Patent
Ishige et al.

(10) Patent No.: US 7,304,710 B2
(45) Date of Patent: Dec. 4, 2007

(54) LIQUID CRYSTAL DISPLAY DEVICE

(75) Inventors: Nobuyuki Ishige, Shirako (JP); Hitoshi Komeno, Mobara (JP)

(73) Assignees: Hitachi Displays, Ltd., Mobara-Shi (JP); Hitachi Device Engineering Co., Ltd., Mobara-Shi (JP)

( * ) Notice: Subject to any disclaimer, the term of this patent is extended or adjusted under 35 U.S.C. 154(b) by 0 days.

(21) Appl. No.: 10/618,748

(22) Filed: Jul. 15, 2003

(65) Prior Publication Data

US 2004/0012744 A1 Jan. 22, 2004

(30) Foreign Application Priority Data

Jul. 17, 2002 (JP) .............................. 2002-207691

(51) Int. Cl.
*G02F 1/1345* (2006.01)
(52) U.S. Cl. ...................................... 349/149; 349/152
(58) Field of Classification Search ......... 349/149–152
See application file for complete search history.

(56) References Cited

U.S. PATENT DOCUMENTS 5,914,763 A * 6/1999 Fujii et al. .................. 349/149
5,949,502 A * 9/1999 Matsunaga et al. ........... 349/40
6,633,359 B1 * 10/2003 Zhang et al. ............... 349/141

FOREIGN PATENT DOCUMENTS

| JP | 9-31141 | 2/1997 |
| JP | 2001-274551 | 10/2001 |

* cited by examiner

*Primary Examiner*—Dung T. Nguyen
(74) *Attorney, Agent, or Firm*—Antonelli, Terry, Stout & Kraus, LLP.

(57) ABSTRACT

A liquid crystal display device has a narrowed peripheral area; more particularly, the liquid crystal display device is characterized in that disconnection or short-circuiting of connecting lines disposed in the narrowed peripheral area is restrained. The liquid crystal display device includes a pixel area having pixel electrodes and a peripheral area surrounding the pixel area. Gate lines and drain lines are disposed in the pixel area, and a gate driver and a drain driver are disposed in the peripheral area. A plurality of gate connecting lines which connect the gate driver and a plurality of gate lines are stacked in the peripheral area.

7 Claims, 15 Drawing Sheets

LIQUID CRYSTAL DISPLAY DEVICE

BACKGROUND OF THE INVENTION

The present invention relates to a liquid crystal display device, and, more particularly, to a liquid crystal display device having an enlarged image display area.

Liquid crystal display devices are used in television sets, personal computers, and as displays for mobile terminals. An active matrix type of liquid crystal display device has transparent substrates disposed in opposition to each other with a liquid crystal interposed therebetween.

FIG. 20 is a diagram of the interconnection lines provided on and at the periphery of a transparent substrate of a typical liquid crystal display device of the type which is currently being manufactured. A liquid-crystal-side surface of one of the transparent substrates is provided with gate lines GW, which are disposed to extend in the x (lateral) direction and to be juxtaposed in the y (longitudinal) direction, and drain (source) lines DW, which are disposed to extend in the y direction and to be juxtaposed in the x direction.

The gate lines GW and the drain lines DW cross one another at right angles, and a switching element and a pixel electrode are formed in each area surrounded by adjacent ones of the gate lines GW and adjacent ones of the drain lines DW, thereby forming a so-called pixel. The switching element is turned on by a scanning signal supplied from the corresponding one of the gate lines GW, and the pixel electrode is supplied with a video signal from the corresponding one of the drain lines DW via the switching element. The areas that are defined by the gate lines GW and the drain lines DW constitute a pixel area AR.

Mobile terminals are being reduced more and more in size, whereas their image display areas are being enlarged more and more to realize better visibility of displayed information. For this reason, in a liquid crystal display device such as shown in FIG. 1, the proportion of the pixel area AR in the transparent substrate is increasing more and more, whereas the peripheral area surrounding the pixel area AR is decreasing more and more. In the typical liquid crystal display device, circuit chips for driving the liquid crystal (hereinafter referred to as drivers) and connecting lines are disposed in the peripheral area.

The gate lines GW and the drain lines DW are electrically connected to a gate driver and a drain driver via gate connecting lines GC and drain connecting lines DC, respectively. In a liquid crystal display device, if the display area is made larger, the distance between each of the gate connecting lines GC or the drain connecting lines DC becomes shorter because of the narrowing of the peripheral area, resulting in the problem of electrical shorting of the gate connecting lines GC or the drain connecting lines DC. In addition, if each of the gate connecting lines GC or the drain connecting lines DC is made thin, the problem of disconnection occurs.

Furthermore, as the peripheral area becomes narrower, an area in which the drivers are disposed becomes smaller. A gate driver GDr has gate signal output terminals on a long side closer to the pixel area AR. The gate connecting lines GC pass through a portion under the gate driver GDr and are connected to a gate common line GCOM. Accordingly, terminals for transmitting or receiving signals cannot be disposed on the side of the gate driver GDr that is closer to a short side of the panel PNL.

SUMMARY OF THE INVENTION

A liquid crystal display device according to the invention includes transparent substrates that are disposed in opposition to each other, with a liquid crystal interposed therebetween. One of the transparent substrates is provided with a plurality of gate lines that are disposed to extend in the x (lateral) direction and to be juxtaposed in the y (longitudinal) direction, and a plurality of drain (source) lines that are disposed to extend in the y direction and to be juxtaposed in the x direction. This substrate has a peripheral area which surrounds a pixel area formed by the plurality of gate lines and the plurality of drain lines.

The plurality of gate lines are connected to a plurality of gate connecting lines formed in the peripheral area. The plurality of gate connecting lines are stacked in the peripheral area. The gate connecting lines extend to a gate common line on a side different from a side where a driver is disposed. Drain connecting lines are disposed under a gate driver.

According to this construction, it is possible to provide a liquid crystal display device having a reduced peripheral area.

DESCRIPTION OF THE PREFERRED EMBODIMENTS

Figure 1:
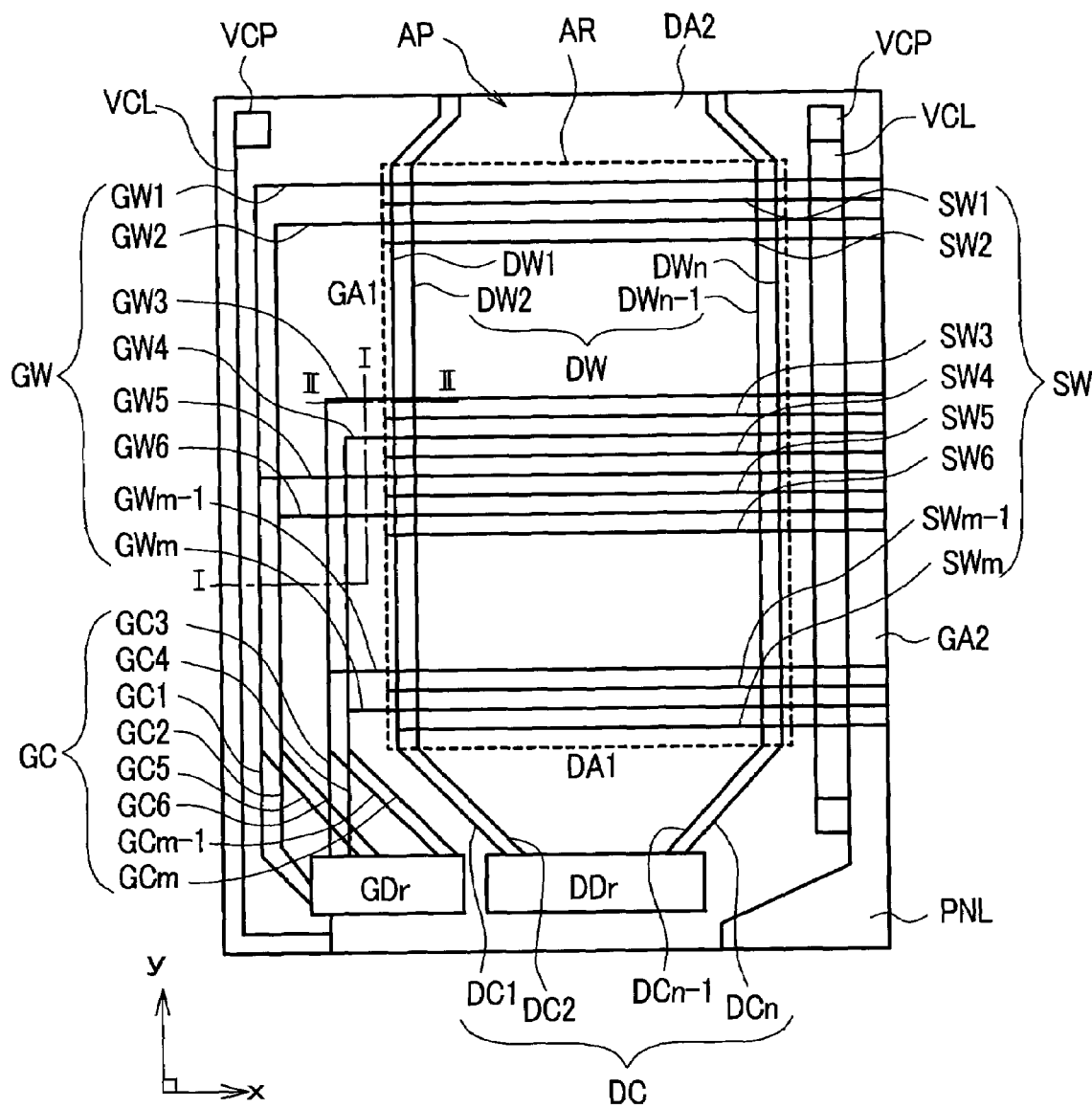
FIG. 1 is a schematic diagram of a substrate of a liquid crystal display device according to the invention.

A first embodiment of the invention will be described below with reference to the accompanying drawings.

In each of the embodiments, parts and portions having the same functions are denoted by the same reference numerals.

FIG. 1 is a schematic diagram of a substrate of a liquid crystal display device for a mobile terminal, according to the invention. The liquid crystal display device has an effective screen with a diagonal size of about 5.08 cm, and FIG. 1 shows a transparent substrate on which pixel electrodes are formed. The liquid crystal display device shown in FIG. 1 is an active matrix type of device.

The active matrix type of liquid crystal display device is provided with polygonal first and second substrates disposed in opposition to each other, with a liquid crystal layer being disposed between the first substrate and the second substrate. Common electrodes are formed on the second substrate. Each of the common electrodes and a corresponding one of the pixel electrodes form a capacitor to hold a voltage.

A liquid-crystal-side surface of the first substrate PNL1 is provided with gate lines GW that are disposed to extend in the x (lateral) direction and to be juxtaposed in the y (longitudinal) direction, and drain lines (or source lines) DW that are insulated from the gate lines GW and are disposed to extend in the y direction and to be juxtaposed in the x direction.

In each area which is surrounded by mutually adjacent ones of the gate lines GW and mutually adjacent ones of the drain lines DW, a switching element and a pixel electrode are formed to constitute a so-called pixel. The switching element is turned on by a scanning signal supplied from the corresponding one of the gate lines GW, while the pixel electrode is supplied with a video signal from the corresponding one of the drain lines DW via the switching element. One example of the switching element is a thin film transistor.

A gate driver GDr and a drain driver DDr are mounted on a panel PNL along one short side thereof by a flip chip attachment scheme. The gate driver GDr is connected to the gate lines GW, while the drain driver DDr is connected to the drain lines DW.

FIG. 1 shows part of the plurality of gate lines GW. In FIG. 1, there are a gate line GW1 for controlling the most distant pixels from the gate driver GDr, a gate line GW2 adjacent to the gate line GW1, a gate line GW4 for controlling the central pixels of the screen of the panel PNL, a gate line GW3 adjacent to the gate line GW4 and positioned on a more distant side from gate driver GDr, a gate line GW5 adjacent to the gate line GW4 and positioned on a side closer to the gate driver GDr, a gate line GW6 adjacent to the gate line GW5, a gate line GWm for controlling the closest pixels to the gate driver GDr, and a gate line GWm−1 adjacent to the gate line GWm. The gate lines GW1, GW2, GW3, GW4, GW5, GW6, GWm−1 and GWm are respectively electrically connected to gate connecting lines GC1, GC2, GC3, GC4, GC5, GC6, GCm−1 and GCm. The gate connecting lines GC1, GC2, GC3, GC4, GC5, GC6, GCm−1 and GCm are connected to the gate driver GDr.

FIG. 1 shows part of the plurality of drain lines DW. In FIG. 1, there are drain lines DW1 and DWn, which are respectively disposed on lateral opposite ends of a pixel area AR. The area surrounded by the gate line GW1 and GWm and the drain lines DW1 and DWn is the pixel area AR. No pixels are formed in a peripheral area AP of the panel PNL.

The panel PNL shown in FIG. 1 is a rectangular substrate having short sides and long sides. In the peripheral area AP thereof, the gate connecting lines GC and a common line VCL are disposed in an area GA1 along one of the long sides (hereinafter referred to as the first long side area GA1). Charge-holding lines SW and a common line VCL are disposed in an area GA2 along the other of the long sides (hereinafter referred to as the second long side area GA2) in the peripheral area AP. The common lines VCL are electrically connected to the common electrodes that are disposed in opposition to the first substrate PNL1 via a common line connecting terminal VCP.

In the peripheral area AP, IC chips for driving the liquid crystal display device are fixed in an area DA1 along one of the short sides (hereinafter referred to as the first short side area DA1).

The driver circuit chip DDr, which is electrically connected to the drain lines DW (hereinafter referred to the drain driver) DDr) is disposed in an area containing the central portion of the first short side area DA1. The drain lines DW and the drain driver DDr are interconnected by drain connecting lines DC.

Figure 2:
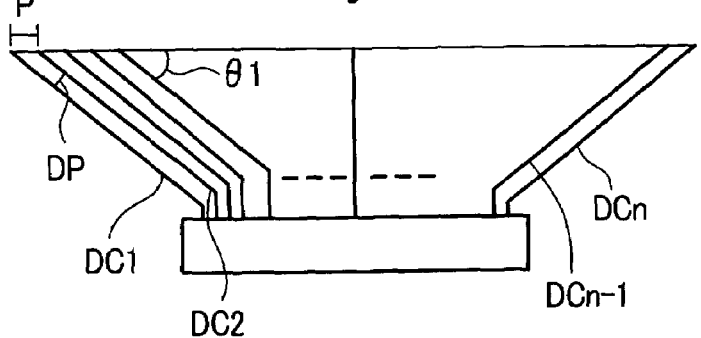
FIG. 2 is a diagram of the layout of drain connecting lines according to the invention.

FIG. 2 is a diagram showing the layout of the drain connecting lines DC in the peripheral area AP on the side where the drain driver DDr is disposed. A first drain connecting line DC1 positioned on the leftmost side and a second drain connecting line DC2 adjacent to the first drain connecting line DC1 are spaced apart from each other by a distance DP. Since the first drain connecting line DC1 and the second drain connecting line DC2 are disposed in parallel with each other, the distance DP can be made constant, and the width of each of the drain connecting lines DC can be made constant. Accordingly, electrical short-circuiting and disconnection can be restrained from occurring in any of the drain connecting lines DC over the entire length thereof.

The interconnection resistances of the respective drain connecting lines DC are made uniform from a drain connecting line extending to the most distant position from the drain driver DDr to a drain connecting line extending to the closest position. Since the interconnection resistances are uniform, the rounding of signal waveforms supplied from the drain driver DDr to individual pixels is made uniform. Since the interconnection resistances are uniform, variations in display characteristic among the pixels can be reduced.

As the difference in length between each of the drain connecting lines DC is made smaller and the distance DP is made larger, the interconnection resistances of the respective drain connecting lines DC can be made uniform more easily. The distance DP can be calculated by DP=sin θ1×P, where P is the pixel pitch. The pixel pitch P is a value to be determined according to the type of product, and the distance DP can be increased by increasing the angle θ1. Since the drain driver DDr is disposed in the central portion of the first short side area DA1, the distance DP can be maximized.

The driver circuit chip (hereinafter referred to the gate driver) GDr, which is electrically connected to the gate lines GW, is disposed on the left side of the drain driver DDr with a space interposed therebetween. According to this construction, the drain driver DDr needs only to be mounted on one side of the first substrate PNL1, and the peripheral area AP of the first substrate PNL1 can be made small on the other side on which no drivers are disposed.

The gate driver GDr has a rectangular shape with long sides parallel to the short sides of the panel PNL and short sides parallel to the long sides of the panel PNL. The gate connecting lines GC are connected to terminals provided on the long and short sides of the gate driver GDr that are exposed to the display area AR.

Since part of the terminals are provided on the short side of the gate driver GDr, the long sides of the gate driver GDr can be made short, whereby an increase in the peripheral area AP can be restrained. In addition, since the long sides of the gate driver GDr can be made short, the incident angle θ1 of the drain connecting lines DC, with respect to the Y axis, can be increased, whereby the yield factor of manufacture can be improved.

The gate connecting lines GC1, GC2, GC3 and GC4 are connected to the upper half (more distant from the gate driver GDr) of the gate connecting lines GC of the pixel area AR, while the gate connecting lines GC5, GC6, GCm−1 and GCm are connected to the lower half (closer to the gate driver GDr) of the gate connecting lines GC of the pixel area AR, and each of the gate connecting lines GC1, GC2, GC3 and GC4 is disposed to overlap a respective one of the gate connecting lines GC5, GC6, GCm−1 and GCm. In a first long side area GA1, the gate connecting line GC1 and the gate connecting line GC5 overlap each other, the gate connecting line GC2 and the gate connecting line GC6 overlap each other, the gate connecting line GC3 and the gate connecting line GCm−1 overlap each other, and the gate connecting line GC4 and the gate connecting line GCm overlap each other.

In the first short side area DA1, the gate connecting line GC5 is insulated from and crosses the gate connecting lines GC1, GC2, GC3 and GC4, which are connected to the upper half of the gate connecting lines GC.

Figure 3:
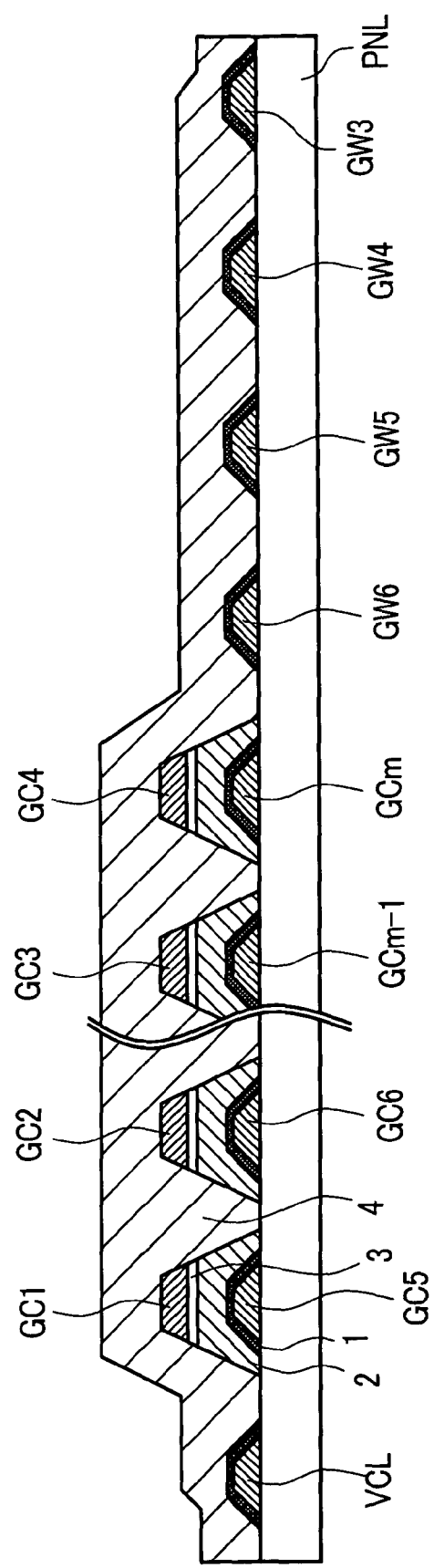
FIG. 3 is a cross-sectional view of the display device, taken along line I-I of FIG. 1.

FIG. 3 is a cross-sectional view taken along line I-I of FIG. 1.

The gate connecting lines GC1, GC2, GC3 and GC4 are connected to the upper half (more distant from the gate driver GDr) of the gate connecting lines GC of the pixel area AR and are respectively disposed to overlie the gate connecting lines GC5, GC6, GCm−1 and GCm, which are connected to the lower half (closer to the gate driver GDr) of the gate connecting lines GC of the pixel area AR.

As shown in FIG. 3, the underlying gate connecting lines GC5, GC6, GCm−1 and GCm are formed on the panel PNL, and the overlying gate connecting lines GC1, GC2, GC3 and GC4 are respectively formed to overlie the underlying gate connecting lines GC5, GC6, GCm−1 and GCm. The gate connecting lines GC3 and GC4 are overlying gate lines which extend so as to climb over the underlying gate connecting lines GCm−1 and GCm, respectively.

The overlying gate connecting lines GC1, GC2, GC3 and GC4 and the underlying gate connecting lines GC5, GC6, GCm−1 and GCm are controlled in different manners.

Each of the underlying gate connecting lines GC5, GC6, GCm−1 and GCm has an oxide film 1 formed by oxidizing its surface. A first protective film 2, for the purpose of providing an electrical insulation between the underlying gate connecting lines GC5, GC6, GCm−1 and GCm and the overlying gate connecting lines GC1, GC2, GC3 and GC4, is formed on the oxide film 1. A second protective film 4 is formed on the overlying gate connecting lines GC1, GC2, GC3 and GC4. The protection of the gate connecting lines GC and the insulation thereof from other interconnection lines can be realized by the second protective film 4.

The pixel area AR of the panel PNL has the first gate line GW1 and the second gate line GW2, and the first gate connecting line GC1, which electrically connects the gate line GW1 to the liquid crystal driving circuit GDr, and the second gate connecting line GC2, which electrically connects the gate line GW2 to the liquid crystal driving circuit GDr, are disposed in the peripheral area AP. The first gate connecting line GC1 and the second gate connecting line GC2 are stacked in the thickness direction of the panel PNL, whereby the pixel area AR can be made narrow and the pixel area AR can be made large.

In addition, the width of each of the gate connecting lines GC can be made thick, whereby the disconnection of any of the gate connecting lines GC can be restrained. Furthermore, the distance between each of the gate lines GW can be made long, whereby the short-circuiting between the gate lines GW can be restrained.

Figure 4:
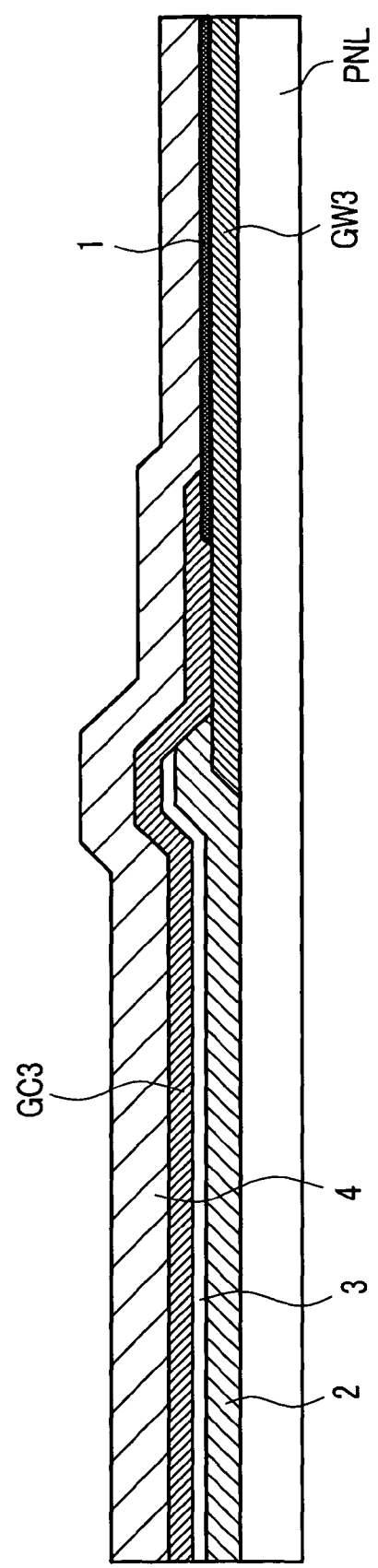
FIG. 4 is a cross-sectional view of the display device, taken along line II-II of FIG. 1.

FIG. 4 is a cross-sectional view taken along line I-I of FIG. 1.

The gate connecting line GC3 is formed on an amorphous silicon layer 3 that is formed on the first protective film 2. The gate connecting line GC3 overlaps part of the gate line GW3 and is electrically connected to the gate line GW3. The gate line GW3 has an oxide film 1 on its surface, but does not have an oxide film in the portion of the gate line GW3 that is connected to the gate connecting line GC3. In this construction, the gate line GW3 and the gate connecting line GC3 are electrically connected to each other.

Figure 5:
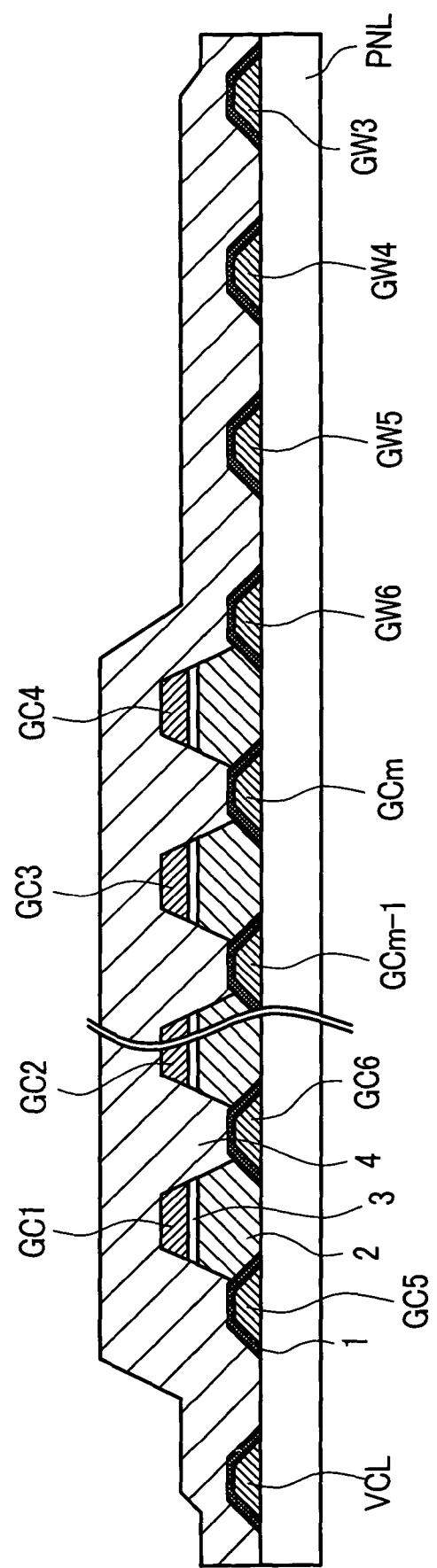
FIG. 5 is a cross-sectional view of the display device, showing another example of the construction of the gate connecting lines according to the invention.

FIG. 5 is a cross-sectional view showing another example of the construction of the gate connecting lines GC, taken along line I-I of FIG. 1. In FIG. 5, the overlying gate connecting lines GC1 to GC4 and the underlying gate connecting lines GC5 to GCm are disposed so as to be shifted from one another.

As shown in FIG. 5, each of the overlying gate connecting lines GC1 to GC4 is formed above the interspace between a respective pair of the underlying gate connecting lines GC5 to GCm, whereby it is possible to reduce the added capacitance which is applied between each of the overlying gate connecting lines GC1 to GC4 and a respective one of the underlying gate connecting lines GC5 to GCm. Accordingly, it is possible to reduce the influence of waveform rounding and noise on the image quality.

Figure 6:
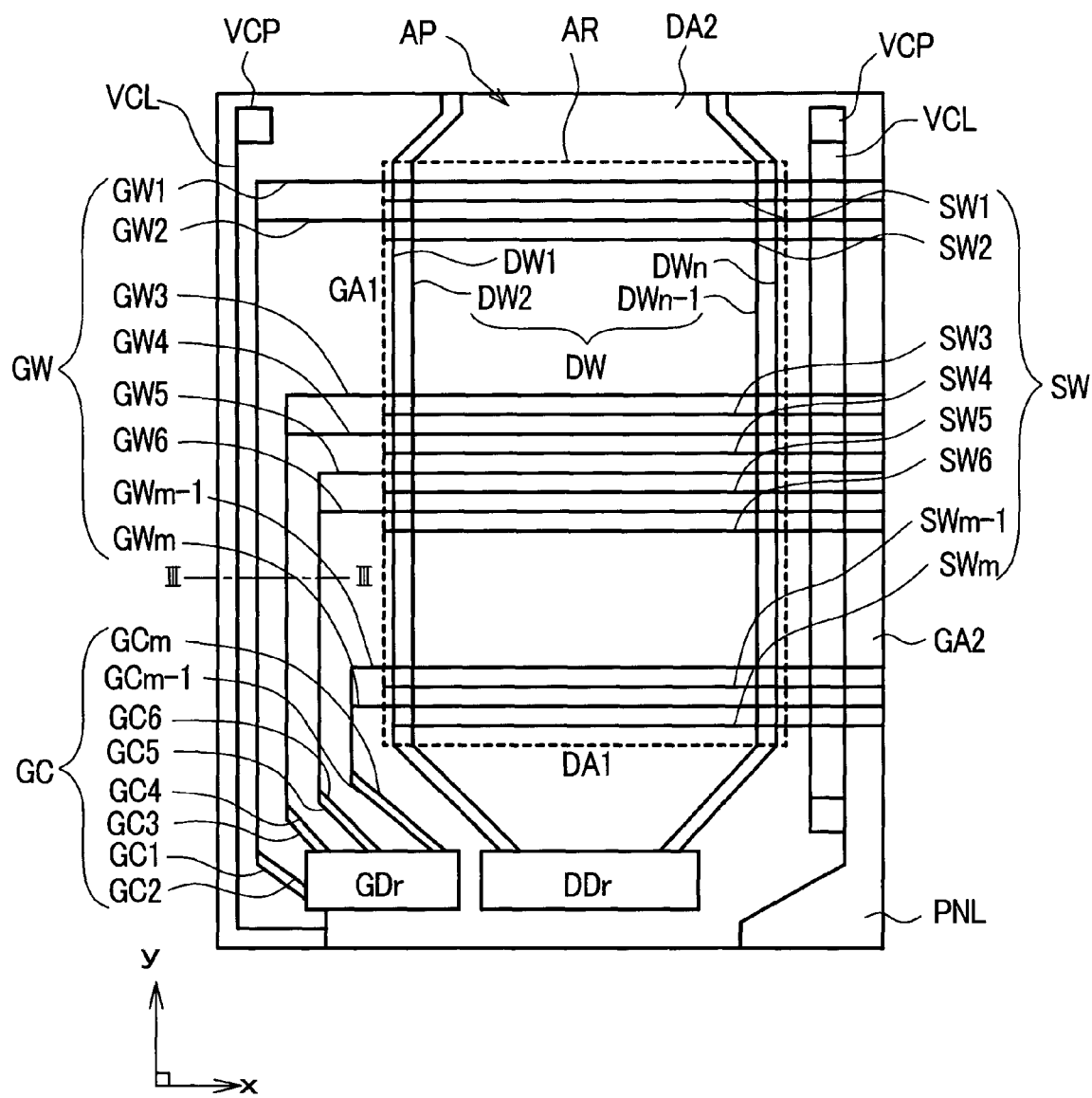
FIG. 6 is a schematic diagram of a substrate of a liquid crystal display device having another structure according to the invention.

FIG. 6 is a schematic diagram of the substrate of a liquid crystal display device having another structure according to the invention.

The gate connecting lines GC shown in FIG. 6 are arranged so that two adjacent gate connecting lines, which are connected to each pair of gate lines that are adjacent to each other, are disposed in a vertically stacked manner. According to this structure, it is possible to reduce the number of crossings of the gate connecting lines GC near the gate driver GDr.

Figure 7:
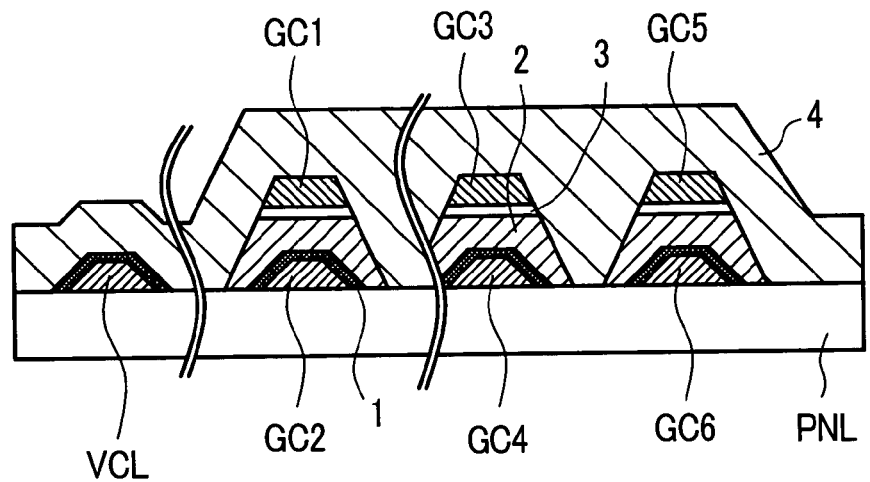
FIG. 7 is a cross-sectional view of the display device, taken along line III-III of FIG. 6.

FIG. 7 is a cross-sectional view taken along line III-III of FIG. 6. The gate connecting line GC1 adjacent to the gate connecting line GC2 is disposed over the gate connecting line GC2. The underlying gate connecting line GC2 has an oxide film 1 on its surface, and the top surface of the oxide film 1 is covered with the first protective film 2. The amorphous silicon layer 3 is formed on the first protective film 2. The underlying gate connecting lines GC and the overlying gate connecting lines GC are positively insulated from each other by the first protective film 2 and the amorphous silicon layer 3.

Figure 8:
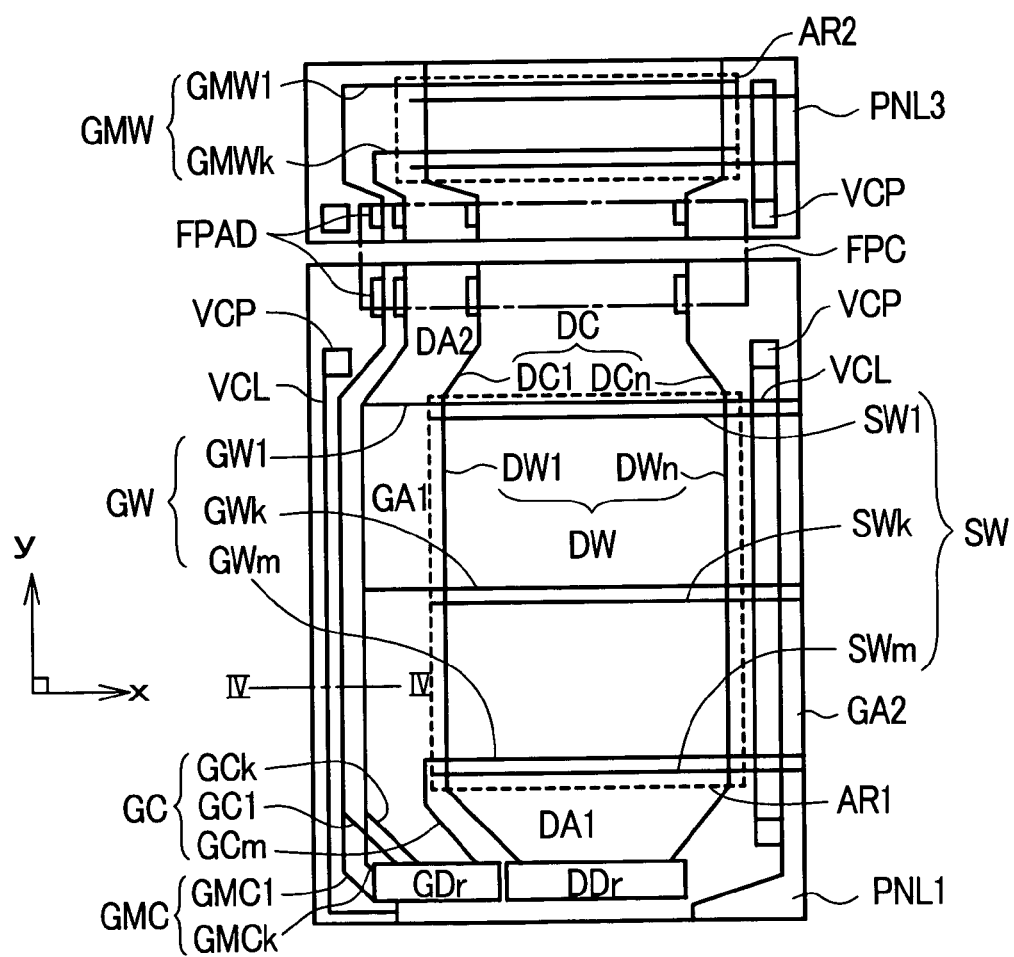
FIG. 8 is a schematic diagram of a liquid crystal display device unit, which drives two liquid crystal display devices by means of one driver, according to the invention.

FIG. 8 is a schematic diagram of substrates of a liquid crystal display device unit in which two separate liquid crystal display devices are driven by one drain driver.

The liquid crystal display device unit has a construction in which one gate driver and one drain driver drive two liquid crystal display devices, i.e., the first liquid crystal display device and the second liquid crystal display device. The first liquid crystal display device and the second liquid crystal display device have a first pixel area AR1 and a second pixel area AR2, respectively.

The first liquid crystal display device has a liquid crystal layer between a first substrate PNL1 and a second substrate PNL2, and the second liquid crystal display device has a liquid crystal layer between a third substrate PNL3 and a fourth substrate PNL4. Elements, such as gate lines, drain lines, gate connecting lines, drain connecting lines, switching elements and pixel electrodes, are formed on the first substrate PNL1 and the third substrate PNL3 of the substrates PNL1 to PNL4.

The gate driver GDr and the drain driver DDr are disposed in the first short side area DA1 of the first substrate PNL1. Flexible-printed-circuit-board connecting pads FPAD for connection to a flexible printed circuit board FPC are formed in an area DA2 of the peripheral area of the first substrate PNL1 on the other short side thereof (hereinafter referred to as the second short side area DA2).

One end of the flexible printed circuit board FPC is connected to the flexible-printed-circuit-board connecting pads FPAD of the first substrate PNL1, while the other end of the flexible printed circuit board FPC is connected to the flexible-printed-circuit-board connecting pads FPAD of the third substrate PNL3.

Gate connecting lines GMC and the drain connecting lines DC are connected to the flexible-printed-circuit-board connecting pads FPAD of the first substrate PNL1. The gate connecting lines GMC and the drain connecting lines DC are respectively connected to the gate lines and the drain lines of the third substrate PNL3 via the flexible printed circuit board FPC.

The gate connecting lines GMC for the second liquid crystal display device are connected to the gate driver GDr by an arbitrary number of lines (k lines). The gate connecting lines GMC for the second liquid crystal display device are disposed to overlie the gate connecting lines GC so that an arbitrary number of the gate connecting lines GMC are juxtaposed in ascending order from the first gate connecting line GC1, that is connected to the most distant gate line GW1 from the gate driver GDr. According to this construction, the number of crossings of the gate connecting lines GMC for the second liquid crystal display device and the gate lines GW is decreased, whereby the disconnection of the gate lines GW can be prevented.

The gate connecting lines GMC1 and GMCk for the second liquid crystal display device are respectively connected to gate lines GMW1 and GMk of the third substrate PNL3 via the flexible printed circuit board FPC.

Figure 9:
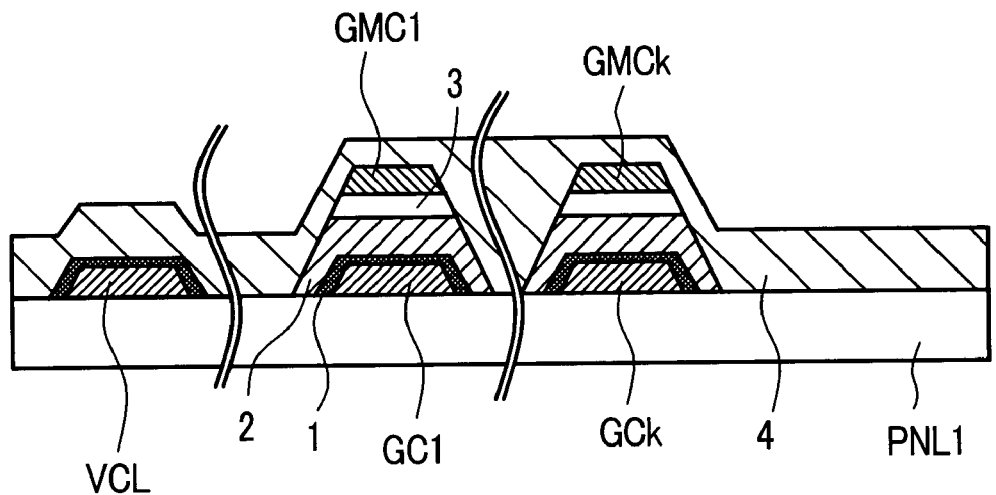
FIG. 9 is a cross-sectional view of a substrate of a liquid crystal display device according to the invention, taken along line IV-IV of FIG. 8.

FIG. 9 is a cross-sectional view of the first substrate PNL1, taken along line IV-IV of FIG. 8.

The gate connecting line GMC1, which is connected to the gate line GMW1 formed on the third substrate PNL3, is disposed to overlie the first gate connecting line GC1, which is connected to the gate line GW1 formed on the first substrate PNL1. The gate connecting line GMCk, which is connected to the gate line GMWk formed on the third substrate PNL3, is disposed to overlie the first gate connecting line GCk, which is connected to the gate line GWk formed on the first substrate PNL1.

Each of the gate connecting lines GC has an oxide film 1 on its surface, and the oxide film 1 is covered with the first protective film 2. The amorphous silicon layer 3 is formed on the first protective film 2. The underlying gate connecting lines GC and the overlying gate connecting lines GMC are positively insulated from each other by the first protective film 2 and the amorphous silicon layer 3.

A second embodiment of the invention will be described below.

Figure 10:
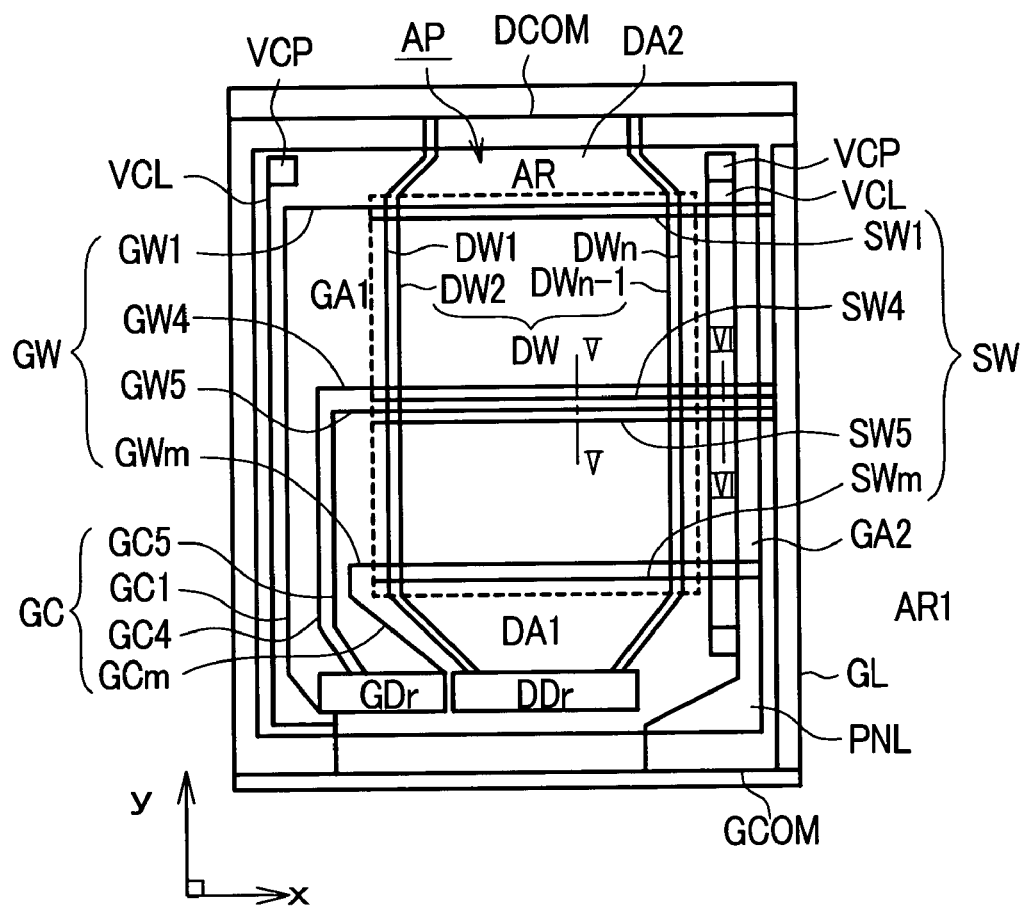
FIG. 10 is a schematic diagram of a substrate of a liquid crystal display device according to a second embodiment of the invention.

FIG. 10 is a diagram of a glass plate GL including a substrate of a liquid crystal display device according to the second embodiment of the invention. The panel PNL is cut from the glass plate GL on which thin film transistors and peripheral interconnection lines are formed. The gate lines GW are connected to a gate common line GCOM that is disposed outside of the panel PNL. A voltage is supplied from the gate common line GCOM to form the oxide film 1 on the surface of each of the gate lines GW (anodic oxidation).

In order to enable static electricity to escape during the manufacturing process, the drain lines DW extend to the second short side area DA2 opposed to the first short side area DA1 in which the drain driver DDr is disposed, and they are electrically connected to a drain common line DCOM beyond a short side of the panel PNL.

The charge-holding lines SW are electrically connected to the gate common line GCOM, which is disposed outside of the panel PNL. The charge-holding lines SW extend to the gate common line GCOM from the same side as the gate lines GW. A voltage is supplied from the gate common line GCOM to oxidize the surface of each of the gate lines GW. The gate lines GW and the charge-holding lines SW are disposed in parallel to one another, and the common line VCL is disposed to cross the gate lines GW and the charge-holding lines SW at right angles.

Figure 11:
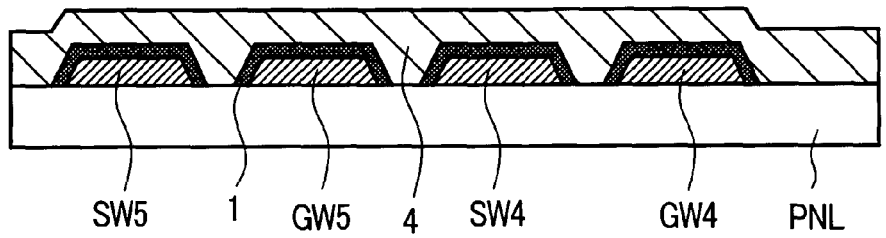
FIG. 11 is a cross-sectional view of the display device, taken along line V-V of FIG. 10.

FIG. 11 is a cross-sectional view taken along line V-V of FIG. 10. The gate lines GW4 and GW5 and charge-holding lines SW4 and SW5 are formed on the panel PNL. The gate lines GW4 and GW5 and the charge-holding lines SW4 and SW5 are formed of aluminum. The surface layer of aluminum is oxidized. In addition, the protective film 4 is formed to cover the gate lines GW4 and GW5 and the charge-holding lines SW4 and SW5. The protective film 4 is formed to protect the lines GW4, GW5, SW4 and SW5 and to insulate the lines GW4, GW5, SW4 and SW5 from one another.

Figure 12:
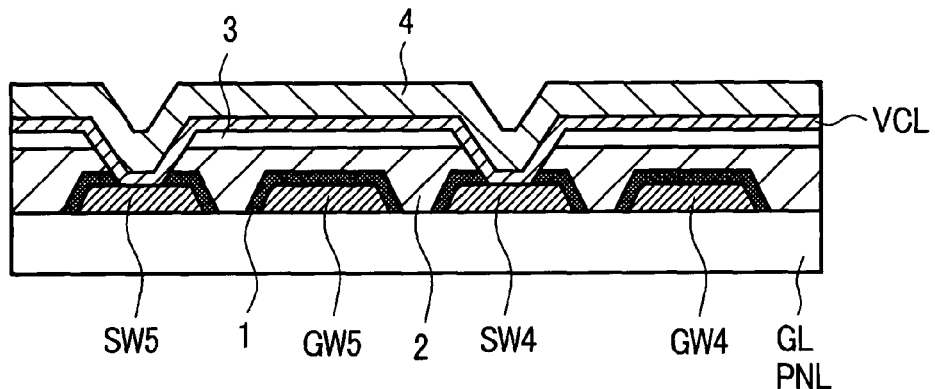
FIG. 12 is a cross-sectional view of the display device, taken along line VI-VI of FIG. 10.

FIG. 12 is a cross-sectional view taken along line VI-VI of FIG. 10. The gate lines GW (GW4 and GW5) and the charge-holding lines SW (SW4 and SW5) are formed on the substrate PNL. The gate lines GW4 and GW5 and the charge-holding lines SW4 and SW5 are formed of aluminum.

Each of the gate lines GW (GW4 and GW5) has an oxidized surface layer. The first protective film 2 is stacked on the gate lines GW (GW4 and GW5), each having the oxidized surface layer. The amorphous silicon layer 3 is stacked on the first protective film 2.

The charge-holding lines SW (SW4 and SW5) are formed at the same level as the gate lines GW (GW4 and GW5), and an oxide layer does not overlie the portion of any of the charge-holding lines SW (SW4 and SW5) that is connected to the common line VCL. During anodic oxidation, the portion of each of the charge-holding lines SW (SW4 and SW5) that is connected to the common line VCL is covered with a resist so that the oxidation of the connection portion is prevented.

Holes are formed in the first protective film 2 and the amorphous silicon layer 3 formed on the charge-holding lines SW (SW4 and SW5).

The common line VCL is formed on the amorphous silicon layer 3. Since the first protective film 2 and the amorphous silicon layer 3 overlie the gate lines GW (GW4 and GW5), the gate lines GW (GW4 and GW5) are insulated from the common line VCL. The holes are formed in the first protective film 2 and the amorphous silicon layer 3 that is formed on the charge-holding lines SW (SW4 and SW5), thereby providing electrical connection between the common line VCL and the charge-holding lines SW (SW4 and SW5).

The second protective film 4 is formed on the common line VCL in order to protect the common line VCL and insulate the common line VCL from other lines.

In the structure shown in FIG. 12, the gate lines GW (GW4 and GW5) and the charge-holding lines SW (SW4 and SW5) are electrically connected to the gate common line GCOM for anodic oxidation, whereby an oxide layer can be formed on each of the gate lines GW (GW4 and GW5) and the charge-holding lines SW (SW4 and SW5), and the charge-holding lines SW (SW4 and SW5) can be connected to the common line VCL.

When the glass plate GL is cut along the external shape of the panel PNL, the gate lines GW are divided into individual gate lines.

Since the gate lines GW and the charge-holding lines SW that are connected to the gate common line GCOM for anodic oxidation are disposed on the same side as the common line VCL, lines which have heretofore been disposed under the gate driver GDr and connected to the gate common line GCOM in the related art become unnecessary.

Figure 13:
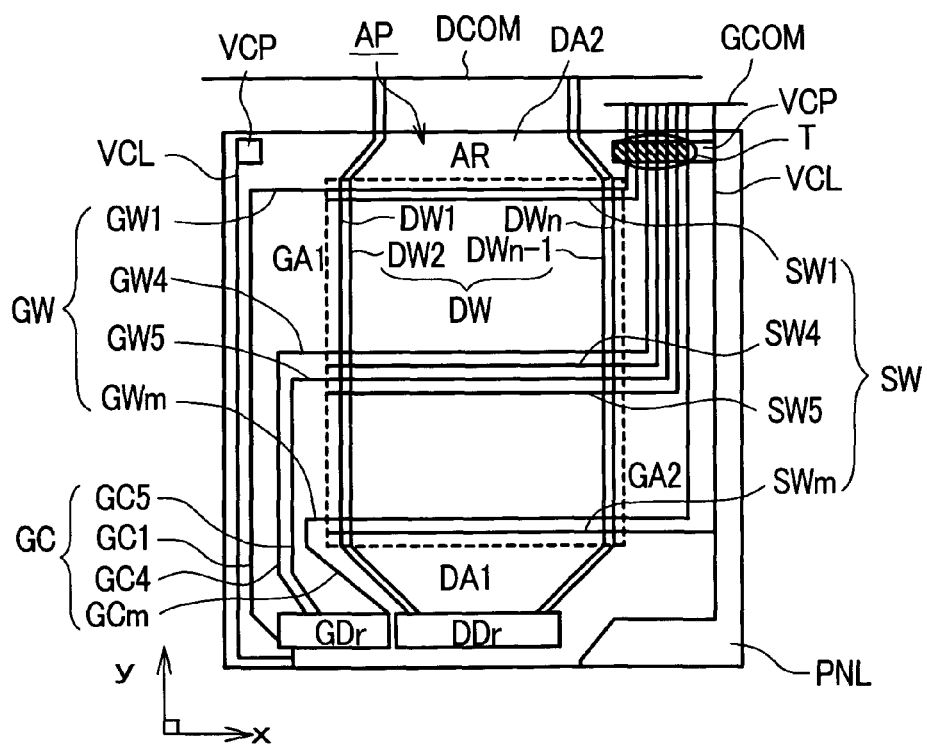
FIG. 13 is a schematic diagram showing interconnection lines provided on and at the periphery of the substrate of the liquid crystal display device according to the invention.

FIG. 13 is a diagram of interconnection lines provided on and at the periphery of the panel PNL of the liquid crystal display device. A cross-section of the structure within the circled area T in FIG. 13 is shown in FIG. 12.

The common line VCL extends in parallel with the gate lines GW.

In the liquid crystal display device shown in FIG. 13, the gate lines GW and the charge-holding lines SW are connected to the gate common line GCOM in the second short side area DA2, opposite to the first short side area DA1 in which the gate driver GDr is disposed.

In addition, in the liquid crystal display device shown in FIG. 13, since the drain lines DW, that are connected to the drain common line DCOM and the gate lines GW, and the charge-holding lines SW, that are connected to the gate common line GCOM, are disposed on only one side, troubles due to static electricity can be reduced. Specifically, it is possible to reduce troubles, such as the generation of static electricity, which tends to cause variations in the thresholds of individual TFTs and cause non-uniformity in the display. In addition, it is possible to reduce disconnection due to electrolytic corrosion.

The gate lines GW and the charge-holding lines SW, connected to the gate common line GCOM, are disposed to extend toward the gate common line GCOM on a side except the side where the gate driver GDr is mounted.

According to the second embodiment, since the gate lines GW and the charge-holding lines SW, which are connected to the gate common line GCOM, are disposed on the side except the side where the gate driver GDr is mounted, lines which have heretofore been disposed under the gate driver GDr and connected to the gate common line GCOM become unnecessary. Accordingly, the gate driver GDr can have terminals disposed on all sides, and it can be reduced in size.

Each of the charge-holding lines SW has an oxide film in the display area AR. This is because, since the charge-holding lines SW cross the drain lines DW at right angles, similar to the gate lines GW crossing the drain lines DW at right angles, the charge-holding lines SW need to have the same structure as the gate lines GW. Short-circuiting of the charge-holding lines SW can be restrained by the oxide film formed as an insulating layer.

The common line VCL is provided to feed a common voltage to the common electrodes and to apply a constant voltage to the charge-holding lines SW. If the resistance of the common line VCL with respect to the charge-holding lines SW greatly differs between the top and the bottom of the screen of the panel PNL, a voltage drop will occur, resulting in luminance irregularity. Accordingly, the common line VCL is made thick to reduce the difference in the resistance of the common line VCL with respect to the charge-holding lines SW between the top and the bottom of the screen.

Figure 14:
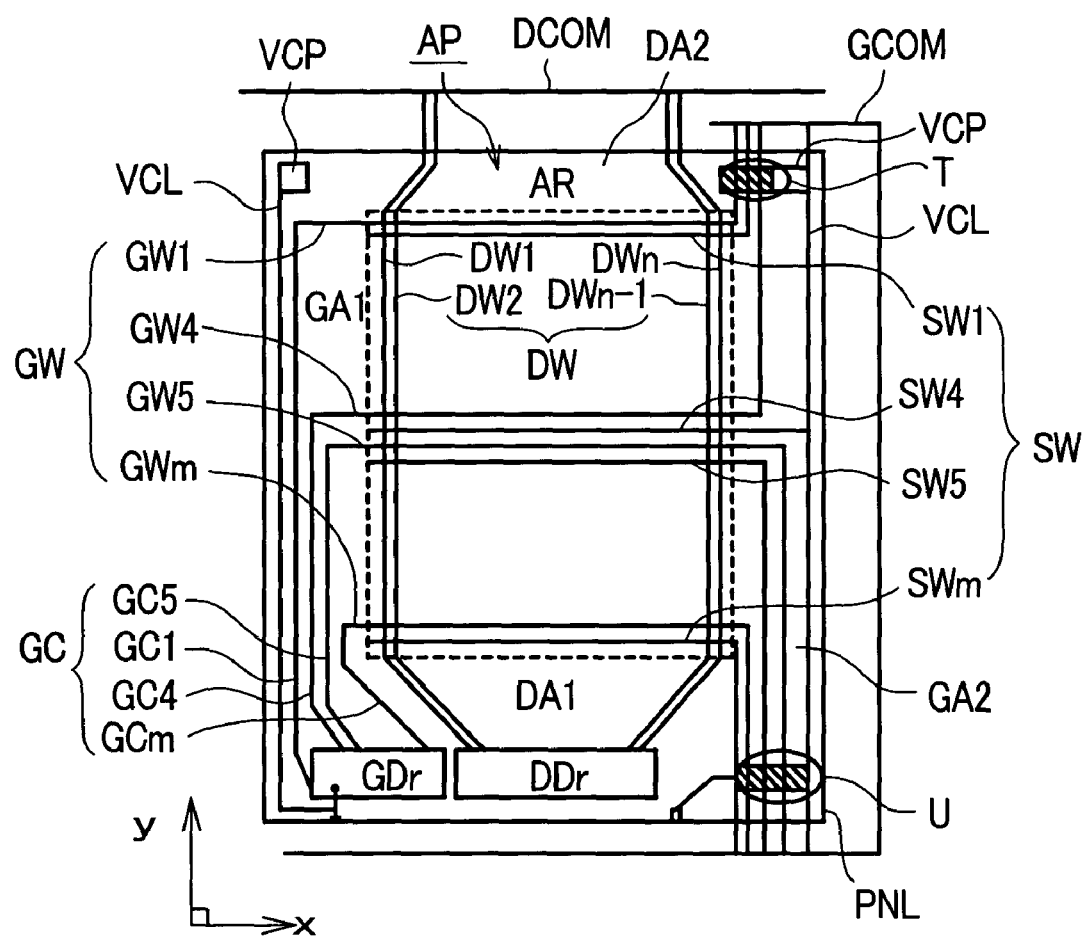
FIG. 14 is a schematic diagram showing interconnection lines provided on and at the periphery of the substrate of the liquid crystal display device according to the invention.

FIG. 14 is a diagram showing the interconnection lines provided on and at the periphery of the panel PNL of the liquid crystal display device. A cross-section of the structure within each of the circled areas T and U in FIG. 14 is shown in FIG. 12.

The gate lines GW and the charge-holding lines SW which are connected to the gate common line GCOM are disposed to extend to the gate common line GCOM in the first short side area DA1, where the gate driver GDr is mounted, and in the second short side area DA2. In the liquid crystal display device shown in FIG. 14, half of the lines GW and SW connected to the gate common line GCOM, which half is closer to the gate driver GDr, extend to the gate common line GCOM in the first short side area DA1 where the gate driver GDr is mounted. On the other hand, the half of the lines GW and SW that are connected to the gate common line GCOM, which half is more distant from the gate driver GDr, extend to the gate common line GCOM in the second short side area DA2. According to the structure shown in FIG. 14, the second long side area GA2 can be made narrow.

Figure 15:
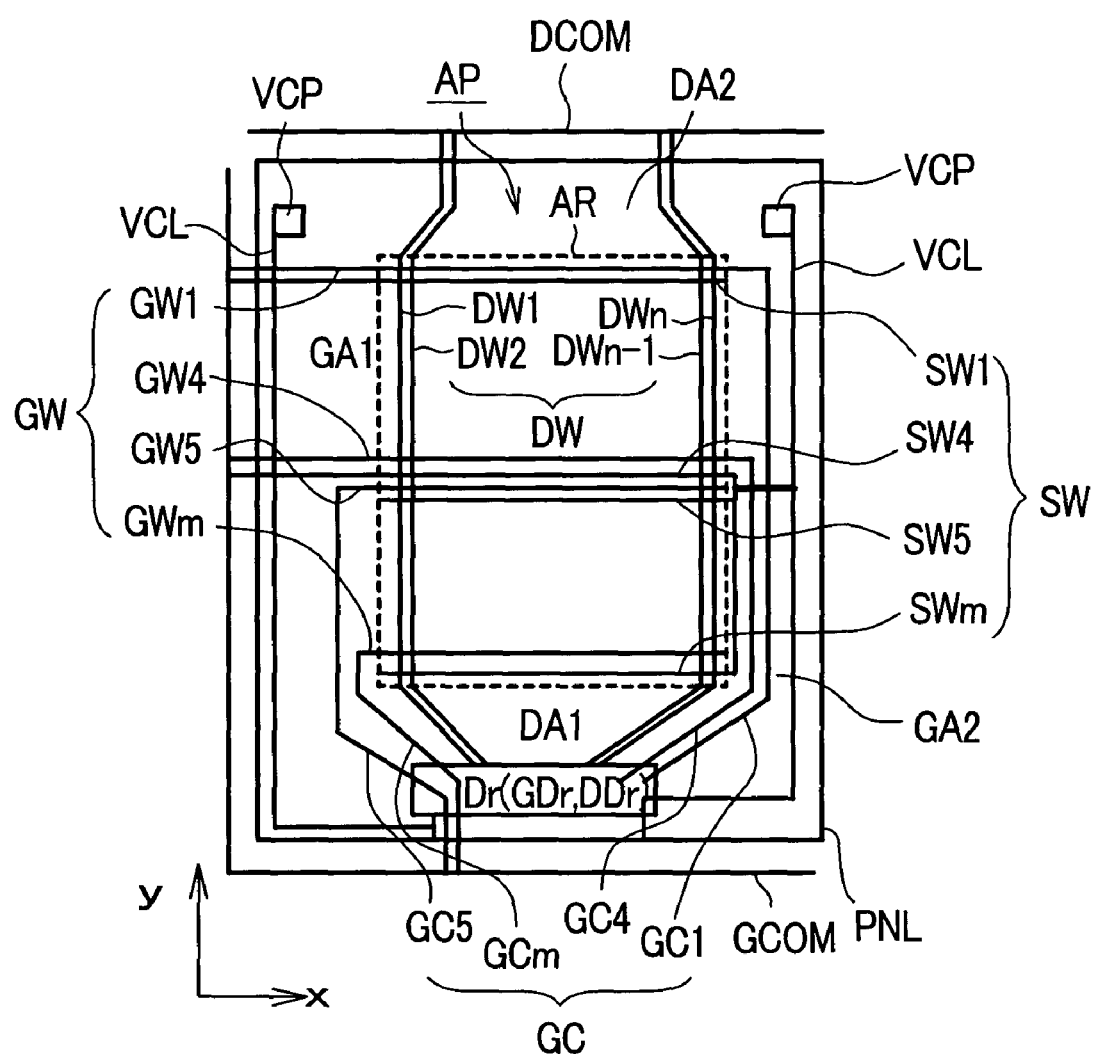
FIG. 15 is a schematic diagram of a substrate of a liquid crystal display device having another construction according to the invention.

FIG. 15 is a diagram showing the layout of interconnection lines in the case where the gate driver GDr and the drain driver DDr are formed on one chip. FIG. 15 shows interconnection lines inside the panel PNL, as well as interconnection lines outside the panel PNL which are being manufactured.

The gate connecting lines GC are connected to the right and left sides of a driver Dr. The half of the gate lines GW that are more distant from the driver Dr extend in parallel with the gate lines GW and are connected to the gate common line GCOM, i.e., they pass through the first long side area GA1 and are connected to the gate common line GCOM. The gate connecting lines GC that are connected to the half of the gate lines GW that are closer to the driver Dr extend into a portion under the driver Dr and are connected to the gate common line GCOM.

According to the structure shown in FIG. 15, the number of interconnection lines passing through the portion under the driver Dr can be reduced.

A third embodiment of the invention will be described below.

Figure 16:
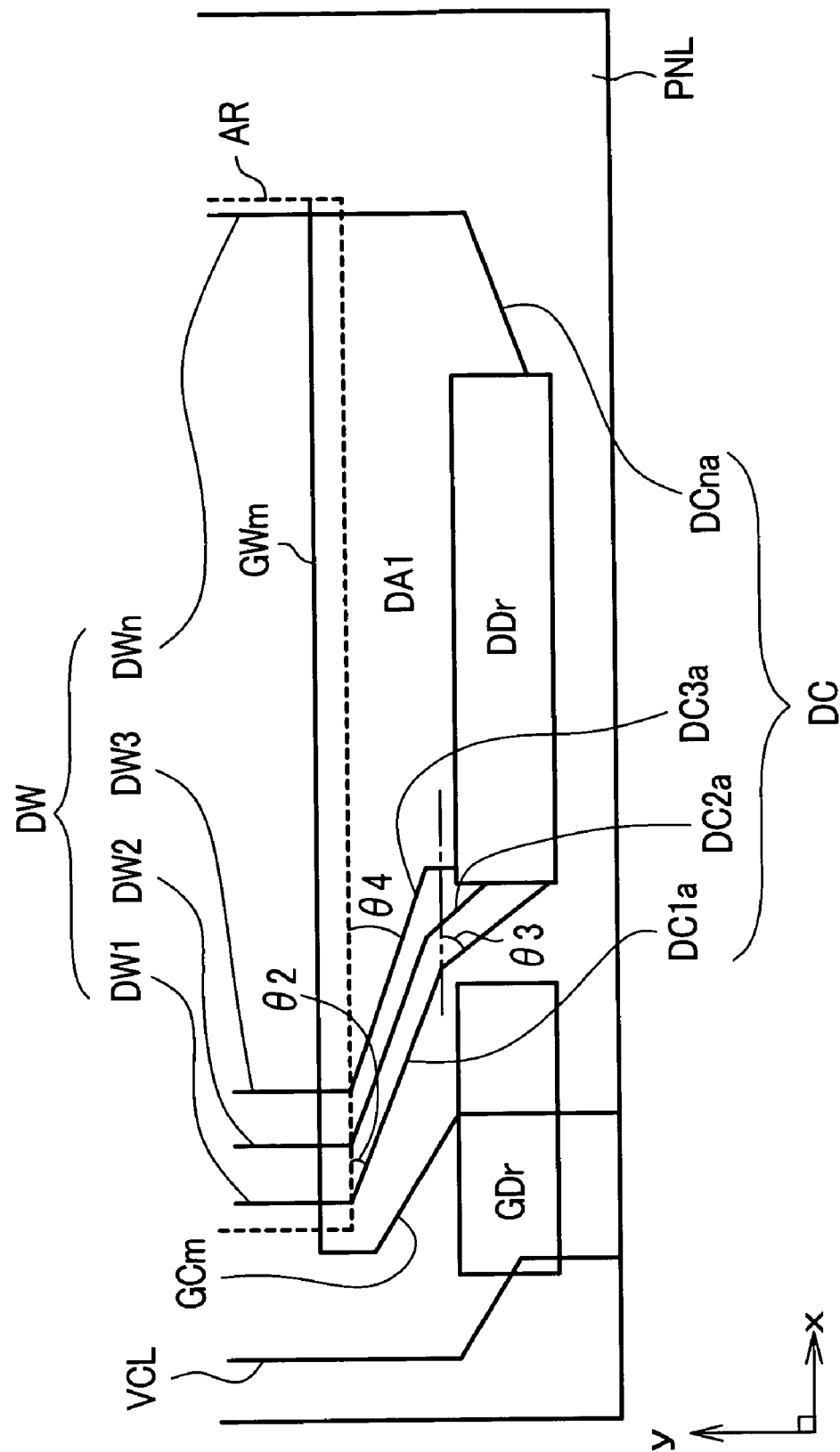
FIG. 16 is a schematic enlarged diagram of the liquid crystal display device of the invention in which a driver is disposed.

FIG. 16 is a schematic enlarged view of part of the interconnection lines of the panel PNL in which the driver Dr is disposed. The gate driver GDr and the drain driver DDr are mounted on the panel PNL by a flip chip attachment scheme.

Drain connecting lines DC1a and DC2a are respectively connected to terminals that are disposed on the short side of the drain driver DDr that is closer to the gate driver GDr. The drain connecting line DC1a is connected to the terminal that is disposed at the closest position to the short side of the panel PNL, while the drain connecting line DC2a is connected to the terminal disposed at the closest position to the pixel area AR. These drain connecting lines DC1a and DC2a are disposed so as to avoid the gate driver GDr.

The drain connecting line DC1a is at an angle θ2 with respect to the pixel area AR in the vicinity of the pixel area AR. Namely, the drain connecting line DC1a is at the angle θ2 with respect to a line parallel to the gate lines GW in the vicinity of the pixel area AR. In addition, the drain connecting line DC1a is at an angle θ3 with a line parallel to the gate lines GW in the vicinity of the drain driver DDr.

The drain connecting line DC3a is connected to a terminal which is disposed at the closest position to the gate driver GDr, of all the terminals provided on a long side of the drain driver DDr. The drain connecting line DC3a is at an angle θ4 with respect to the line parallel to the gate lines GW. The relationship between the angle θ2 and the angle θ3 is θ2<θ3. According to this construction, the peripheral area AP can be made narrow.

Figure 17:
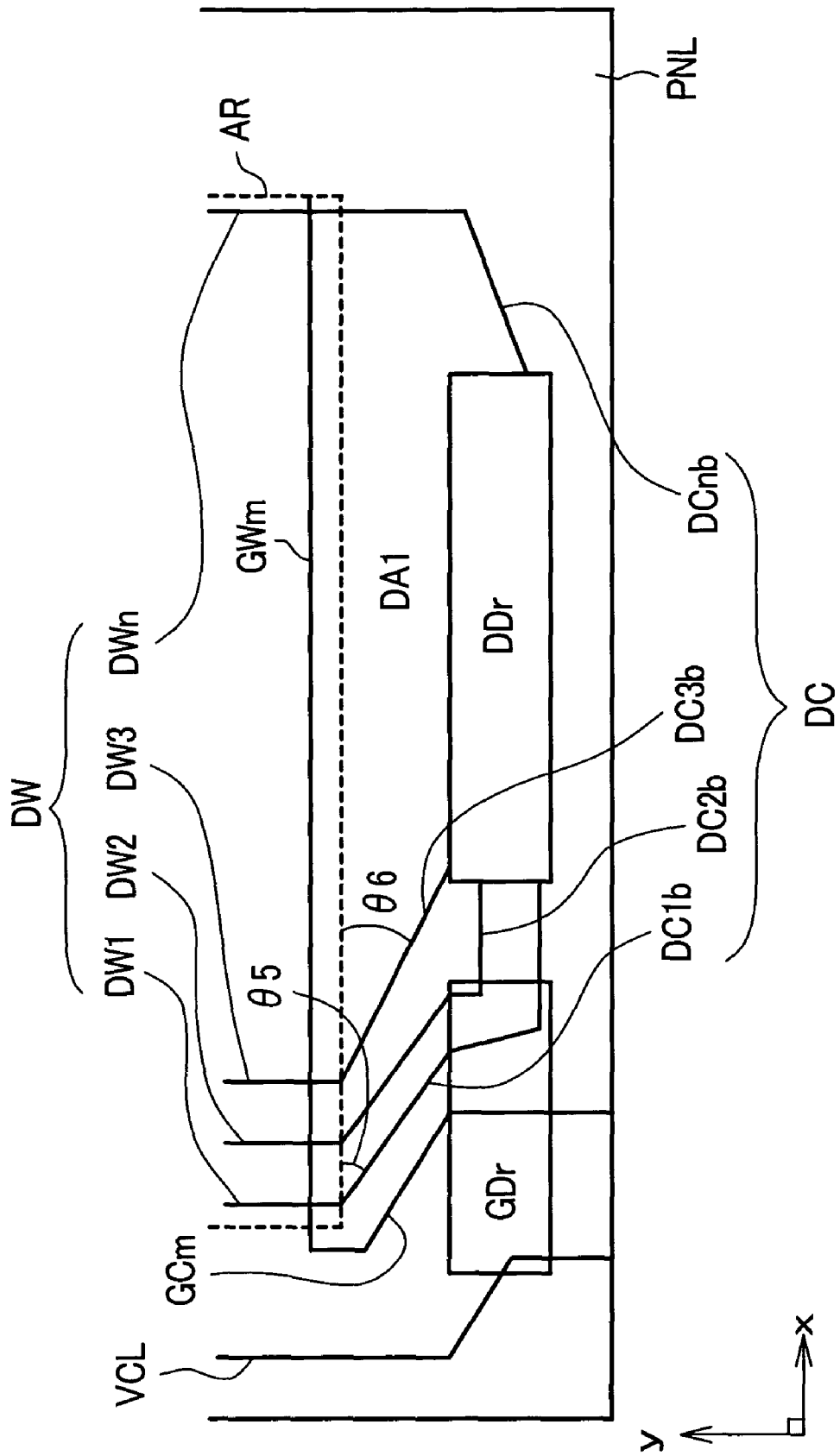
FIG. 17 is a schematic enlarged diagram of the liquid crystal display device of the invention, in which the driver DR is disposed.

FIG. 17 is a schematic enlarged view of part of the interconnection lines of the panel PNL in which the driver Dr is disposed.

The drain connecting lines DC, which are respectively electrically connected to terminals disposed on the short side of the drain driver DDr that is closer to the gate driver GDr pass through a portion under the gate driver GDr, and are electrically connected to the drain lines DW.

Drain connecting lines DC1b and DC2b are respectively connected to the terminals disposed on the short side of the drain driver DDr that is closer to the gate driver GDr. The drain connecting line DC1b is connected to the terminal that is disposed at the closest position to the short side of the panel PNL, while the drain connecting line DC2b is connected to the terminal that is disposed at the closest position to the pixel area AR.

In FIG. 17, the drain connecting line DC1b is at an angle θ5 with respect to a line parallel to the gate lines GW in the vicinity of the pixel area AR. The drain connecting lines DC1b and DC2b, which are connected to the short side of the drain driver Dr that is closer to the gate driver GDr, are disposed so as to be partly parallel to the gate lines GW. These drain connecting lines DC1b and DC2b pass through a portion under the gate driver GDr.

The drain connecting line DC3b is connected to a terminal which is disposed at the closest position to the gate driver GDr, of all the terminals provided on a long side of the drain driver DDr. The drain connecting line DC3b is at an angle θ6 with respect to the line parallel to the gate lines GW.

These drain connecting lines DC1b and DC2b pass through the portion under the gate driver GDr. Accordingly, the angle θ5 between each of the drain connecting lines DC1b and DC2b and the pixel area AR can be increased. Therefore, the distance between each adjacent one of the drain connecting lines DC can be made large, whereby the short-circuiting between the drain lines DW can be reduced. The angle θ5 shown in FIG. 17 can be made larger than the angle θ4 shown in FIG. 16.

According to this construction, the peripheral area AP can be made narrow, and the short-circuiting between the drain lines DW can be restrained. In addition, the disconnection of the drain lines DW can be restrained.

The third embodiment may also be applied to a liquid crystal display device of the type in which the gate driver GDr and the drain driver DDr are mounted on the panel PNL as two independent drivers according to the other embodiments.

Figure 18:
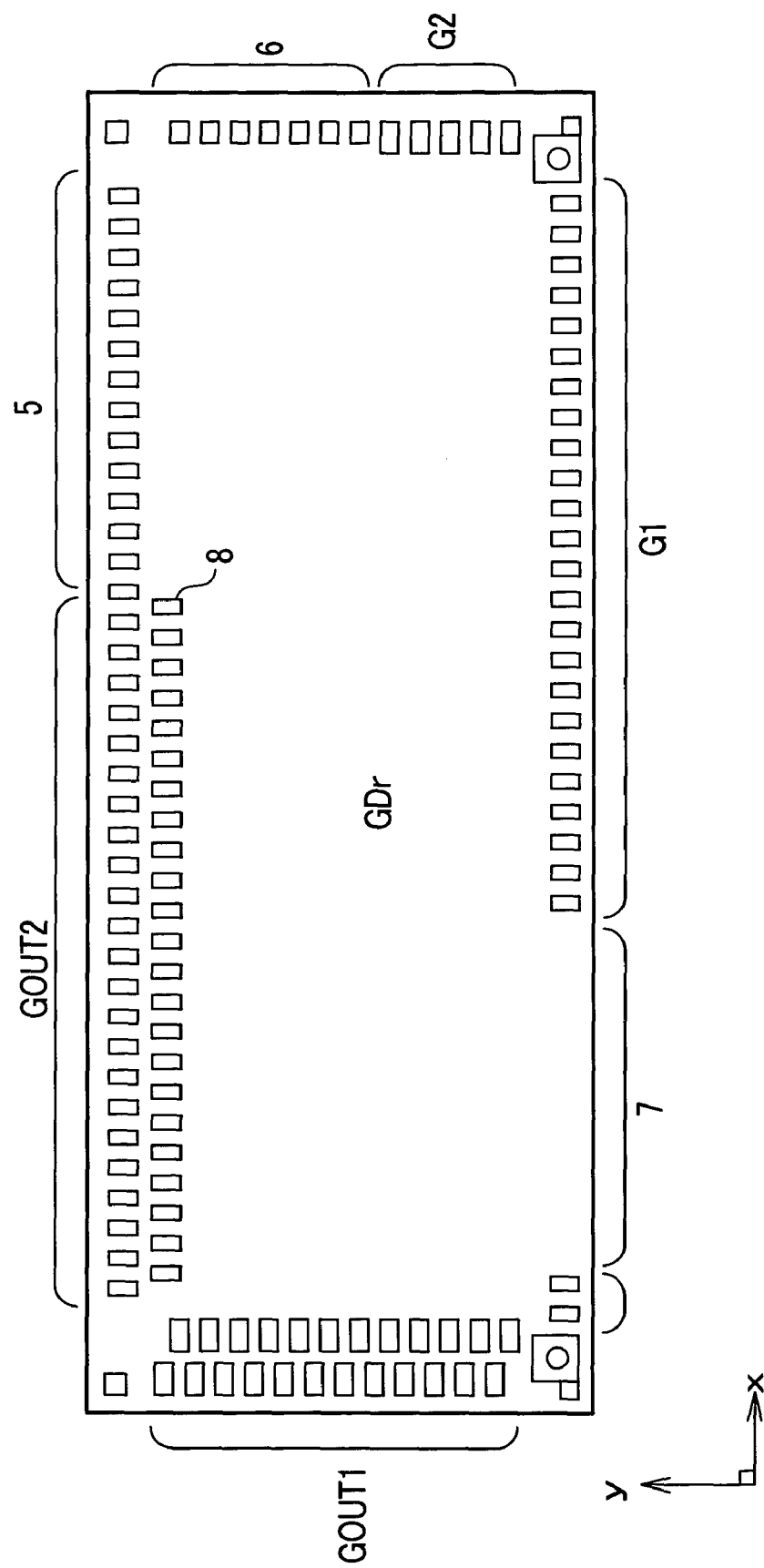
FIG. 18 is a top plan view of the gate driver shown in FIG. 17.

FIG. 18 is a top plan view of the gate driver GDr in FIG. 17, showing the layout of terminals.

The gate driver GDr is rectangular, and terminals 8 are provided on each of the sides of the gate driver GDr. A first output terminal group GOUT1 is disposed on one of the short sides of the gate driver GDr, while a second area 6, through which the drain connecting lines DC can pass, and a gate signal terminal group G2 are disposed on the other short side. The short side where the second area 6 and the gate signal terminal group G2 are disposed is the short side closer to the drain driver DDr.

A second output terminal group GOUT2 and a first area 5 through which the drain connecting lines DC can pass are disposed on one of the long sides of the gate driver GDr, particularly on the long side closer to the pixel area AR. A third area 7, through which lines pass for anodic oxidation of the gate lines GW, and an input/output terminal group G1 of the gate driver GDr are disposed on the other long side of the gate driver GDr.

The terminals 8 provided in the first area 5 and the second area 6 are dummy terminals, and the drain lines DW may also be disposed under the first area 5 and the second area 6, so that electrical interference between the internal circuit of the gate driver GDr and the drain lines DW can be prevented.

According to the above-described construction, it is possible to reduce the peripheral area AP surrounding the pixel area AR.

Figure 19:
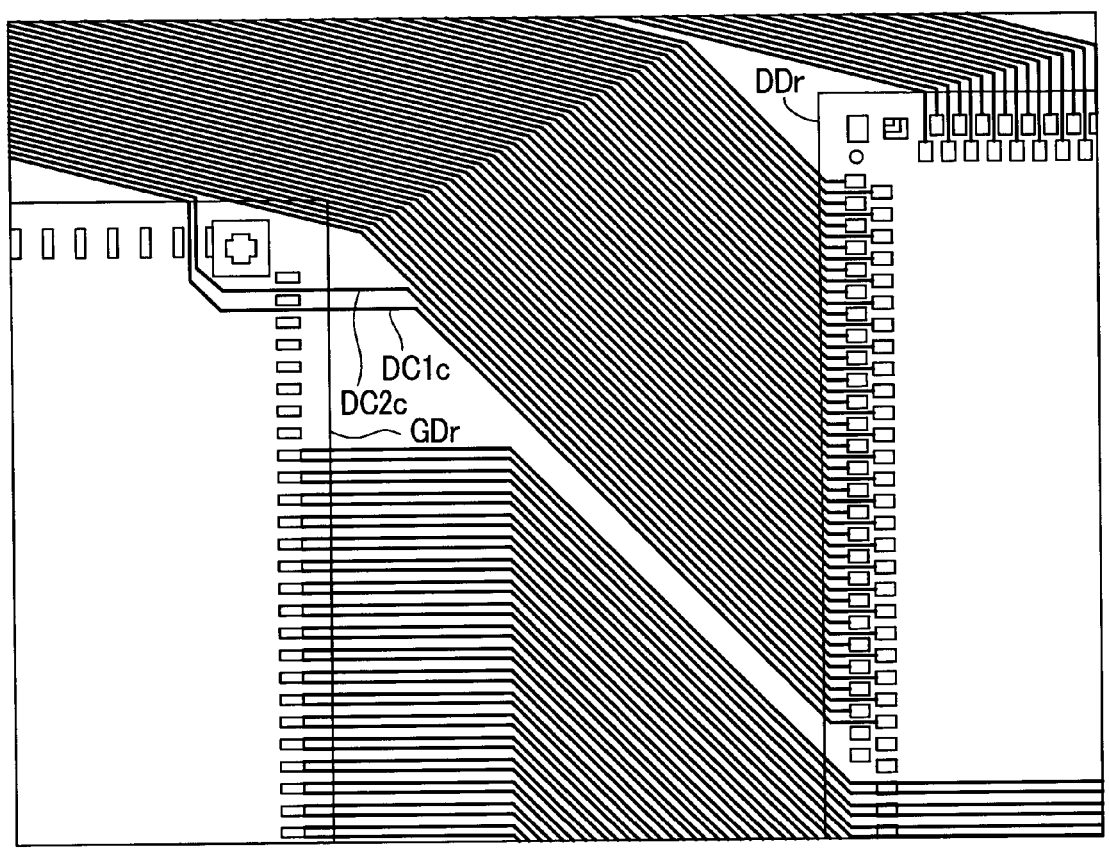
FIG. 19 is a plan view showing the layout of the drain connecting lines DC.
Figure 20:
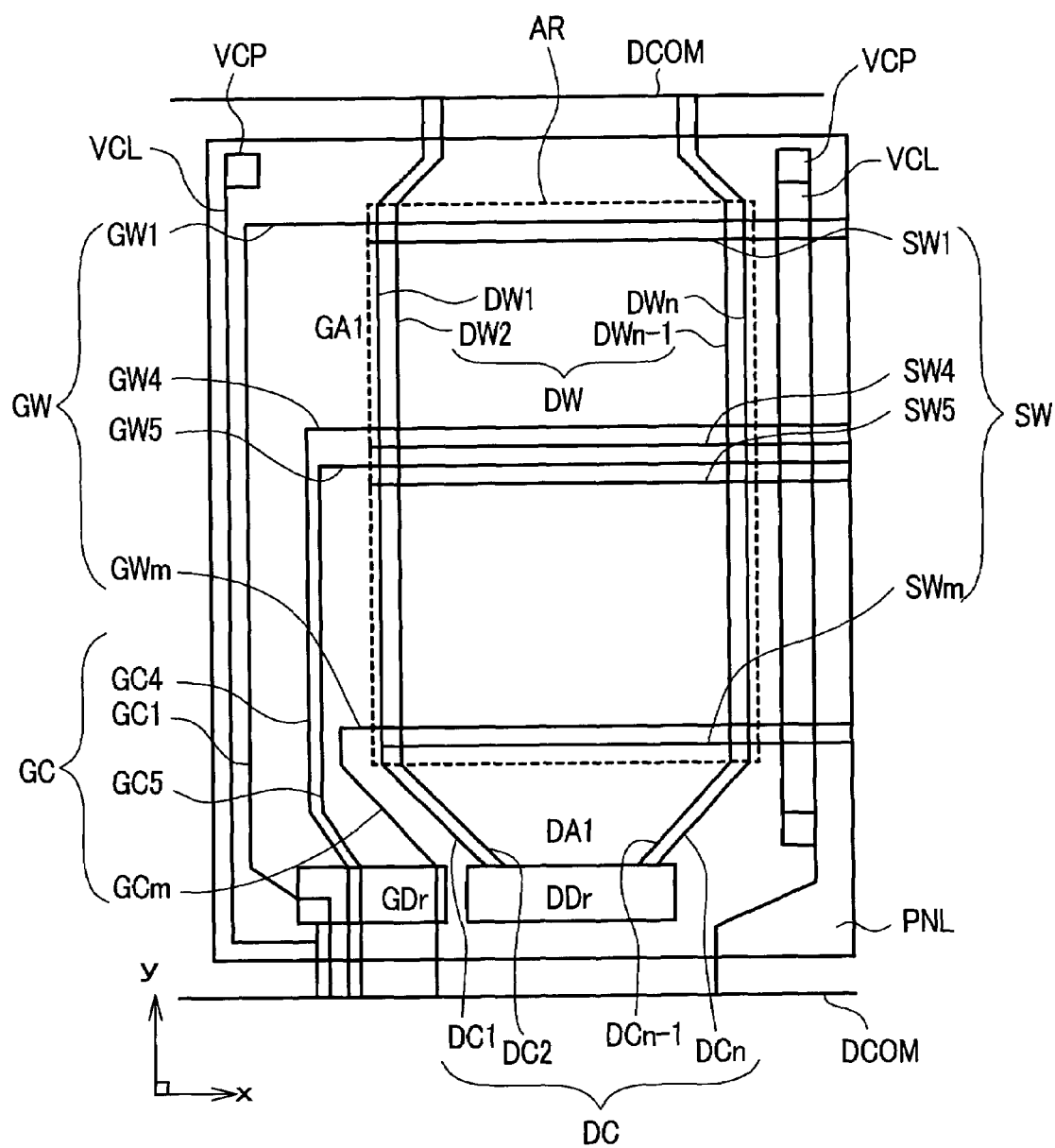
FIG. 20 is a diagram of interconnection lines provided on and at the periphery of a transparent substrate of a typical liquid crystal display device of the type which is currently being manufactured.

FIG. 19 is a plan view of the third embodiment, showing the layout of the drain connecting lines DC.

Part of the drain connecting lines DC that are electrically connected to the short side of the drain driver DDr that is closer to the gate driver GDr pass through a portion under the gate driver GDr and are electrically connected to the drain lines DW. Two of the drain connecting lines DC shown in FIG. 19, i.e., a drain connecting line DC1c positioned on the outermost side and a drain connecting lines DC2c adjacent to the drain connecting line DC1c, pass through a portion between dummy terminals and are connected to the drain lines DW.

According to the above-described construction, it is possible to reduce the peripheral area AP of the panel PNL that surrounds the pixel area AR.

What is claimed is:

1. A liquid crystal display device comprising a first substrate, a second substrate, a liquid crystal layer between the first substrate and the second substrate, wherein
the first substrate has a pixel area, a peripheral area, gate lines, drain lines, first gate connecting lines, second gate connecting lines, a first insulating film, and a second insulating film,
the pixel area includes pixel electrodes, the gate lines and the drain lines,
the peripheral area surrounds the pixel area,
the gate lines include first gate lines and second gate lines,
first gate connecting lines and second gate connecting lines are disposed in the peripheral area,
the respective first gate connecting lines electrically connect the first gate lines to a liquid crystal driving circuit, the respective second gate connecting lines electrically connect the second gate lines to the liquid crystal driving circuit, the first insulating film insulates the first gate connecting lines from the second gate connecting lines, the first gate connecting lines and the second gate connecting lines are stacked in a thickness direction of the first substrate, the second insulating film is formed as a higher layer than the first gate connecting lines and the second gate connecting lines within the first substrate, and the second insulating film expands from the peripheral area to the pixel area.

2. A liquid crystal display device according to claim 1, wherein the first gate lines are more distant from the liquid crystal driving circuit than are the second gate lines, and the first gate connecting lines are positioned at a higher level than are the second gate connecting lines within the first substrate.

3. A liquid crystal display device according to claim 1, wherein one of the first gate connecting lines and one of the second gate connecting lines overlap one another when viewed in plan view.

4. A liquid crystal display device according to claim 1, wherein one of the first gate connecting lines is disposed between the two second gate connecting lines which are adjacent one another when viewed in plan view.

5. A liquid crystal display device comprising a first substrate, a second substrate, a liquid crystal layer between the first substrate and the second substrate, wherein the first substrate has a pixel area, a peripheral area, gate lines, drain lines, first gate connecting lines, and second gate connecting lines, the pixel area includes pixel electrodes, gate lines, and drain lines, the peripheral area surrounds the pixel area, the gate lines include first gate lines and second gate lines, the first gate connecting lines and the second gate connecting lines are disposed in the peripheral area, the respective first gate connecting lines electrically connect the first gate lines to a liquid crystal driving circuit, the respective second gate connecting lines electrically connect the second gate lines to the liquid crystal driving circuit, the first gate connecting lines and the second gate connecting lines are stacked in a thickness direction of the first substrate and are insulated each other, and one of the first gate connecting lines is disposed between two second gate connecting lines which are adjacent one another when viewed in plan view.

6. A liquid crystal display device comprising a first substrate, a second substrate, a third substrate, a fourth substrate, a first liquid crystal layer between the first substrate and the second substrate, and a second liquid crystal layer between the third substrate and the fourth substrate, wherein the first substrate has a first pixel area, a first peripheral area, first gate connecting lines, and second gate connecting lines, the third substrate has a second pixel area and a second peripheral area, the first pixel area has first pixel electrodes, first gate lines, and first drain lines, the first peripheral area surrounds the first pixel area, the second pixel area has second pixel electrodes, second gate lines, and second drain lines, the second peripheral area surrounds the second pixel area, the first gate connecting lines and the second gate connecting lines are disposed in the first peripheral area, the respective first gate connecting lines electrically connect the first gate lines to a liquid crystal driving circuit, the respective second gate connecting lines electrically connect the second gate lines to the liquid crystal driving circuit, and the first gate connecting lines and the second gate connecting lines are stacked in a thickness direction of the first substrate and are insulated each other.

7. A liquid crystal display device according to claim 6, wherein the first substrate has a first insulating film and a second insulating film, the first insulating film insulates the first gate connecting lines from the second gate connecting lines, the second insulating film is formed as a higher layer than the first gate connecting lines and the second gate connecting lines within the first substrate, and the second insulating film expands from the first peripheral area to the first pixel area.

* * * * *